United States Patent
Maxim et al.

(10) Patent No.: US 10,951,183 B2
(45) Date of Patent: Mar. 16, 2021

(54) PA OUTPUT MEMORY NEUTRALIZATION USING BASEBAND I/O CAPACITANCE CURRENT COMPENSATION

(71) Applicant: Qorvo US, Inc., Greensboro, NC (US)

(72) Inventors: George Maxim, Saratoga, CA (US); Baker Scott, San Jose, CA (US); Dirk Robert Walter Leipold, San Jose, CA (US); Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 16/565,718

(22) Filed: Sep. 10, 2019

(65) Prior Publication Data

US 2020/0091878 A1 Mar. 19, 2020

Related U.S. Application Data

(60) Provisional application No. 62/730,603, filed on Sep. 13, 2018.

(51) Int. Cl.
| | |
|---|---|
| *H03F 1/30* | (2006.01) |
| *H03F 3/24* | (2006.01) |
| *H03F 3/45* | (2006.01) |
| *H03F 1/32* | (2006.01) |
| *H04B 1/04* | (2006.01) |
| *H04B 1/16* | (2006.01) |

(52) U.S. Cl.
CPC ........... *H03F 3/245* (2013.01); *H03F 1/3205* (2013.01); *H03F 1/3211* (2013.01); *H03F 3/45071* (2013.01); *H03F 2200/102* (2013.01); *H03F 2200/451* (2013.01); *H03F 2200/48* (2013.01); *H03F 2203/45156* (2013.01); *H04B 1/04* (2013.01); *H04B 1/16* (2013.01)

(58) Field of Classification Search
CPC .................................. H03F 1/30; H03G 3/30
USPC ......................................... 330/297, 296, 285
See application file for complete search history.

(56) References Cited

U.S. PATENT DOCUMENTS 8,611,834 B2 * 12/2013 Harris ................... H03F 1/0288
455/114.1

* cited by examiner

*Primary Examiner* — Henry Choe
(74) *Attorney, Agent, or Firm* — Withrow & Terranova, P.L.L.C.

(57) ABSTRACT

Power amplifier (PA) output memory neutralization is disclosed, using baseband input/output (I/O) capacitance current compensation. Radio frequency (RF) PAs experience I/O memory effects when used with envelope tracking supply modulation schemes. Envelope tracking supply modulation results in a nonlinear variation of the I/O capacitance. Traditional approaches compensate for such effects with a current provided by a bias circuit which is band-limited. This results in memory effects which distort the amplified signal, becoming more significant as the modulation bandwidth increases. An RF communications system according to embodiments disclosed herein mitigates such memory effects by compensating for the non-linear effect of the I/O capacitance in an RF PA.

20 Claims, 5 Drawing Sheets

PA OUTPUT MEMORY NEUTRALIZATION USING BASEBAND I/O CAPACITANCE CURRENT COMPENSATION

RELATED APPLICATIONS

This application claims the benefit of provisional patent application Ser. No. 62/730,603, filed Sep. 13, 2018, the disclosure of which is hereby incorporated herein by reference in its entirety.

FIELD OF THE DISCLOSURE

This disclosure relates to radio frequency (RF) power amplification.

BACKGROUND

As wireless communications technologies evolve, wireless communications systems become increasingly sophisticated. As such, wireless communications protocols continue to expand and change to take advantage of the technological evolution. Under Fifth Generation (5G) protocols, wireless communications devices operate with signals having larger modulation bandwidths than Third Generation (3G) or Fourth Generation (4G) communications protocols. The modulation bandwidths can exceed 100 megahertz (MHz), such as 200 MHz, 400 MHz, 800 MHz, and so on. As a result, power amplifiers (PAs) and other components of wireless communications devices must handle these larger modulation bandwidths while meeting performance requirements, such as specific out-of-band emissions requirements, linearity requirements, and the like. Further, portable wireless communications devices are typically battery powered and need to be relatively small and power efficient.

SUMMARY

Power amplifier (PA) output memory neutralization is disclosed, using baseband input/output (I/O) capacitance current compensation. Radio frequency (RF) PAs experience I/O memory effects when used with envelope tracking supply modulation schemes. Envelope tracking supply modulation results in a nonlinear variation of the I/O capacitance. Traditional approaches compensate for such effects with a current provided by a bias circuit which is band-limited. This results in memory effects which distort the amplified signal, becoming more significant as the modulation bandwidth increases.

An RF communications system according to embodiments disclosed herein mitigates such memory effects by compensating for the non-linear effect of the I/O capacitance in an RF PA. The RF PA can be single- or multi-stage, with an output stage supplied by an envelope tracking power supply. A replica circuit proportionally matches the non-linear I/O capacitance in the output stage. By biasing the replica circuit with the envelope tracking power supply, a replica current is generated. A current mirror generates an error correction current to compensate for the effects of the I/O capacitance in the output stage from the replica current.

An exemplary embodiment relates to a PA. The PA includes an output stage which receives and amplifies an input signal received at a first input node using a supply modulated by an envelope tracking power supply. The PA further includes a replica circuit comprising a non-linear capacitor proportionally matched to a first I/O capacitance of the output stage. The PA further includes a current mirror coupled to the replica circuit and configured to inject a first error correction current into the first input node.

Another exemplary embodiment relates to an RF communications system. The RF communications system includes an amplifier stage configured to provide envelope tracked amplification of an input signal, wherein the amplifier stage has a first I/O capacitance between a first input node and a first output node. The RF communications system also includes a replica circuit configured to proportionally match the first I/O capacitance. The RF communications system also includes a current mirror coupled to the replica circuit and configured to provide an error correction current compensating for the first I/O capacitance.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
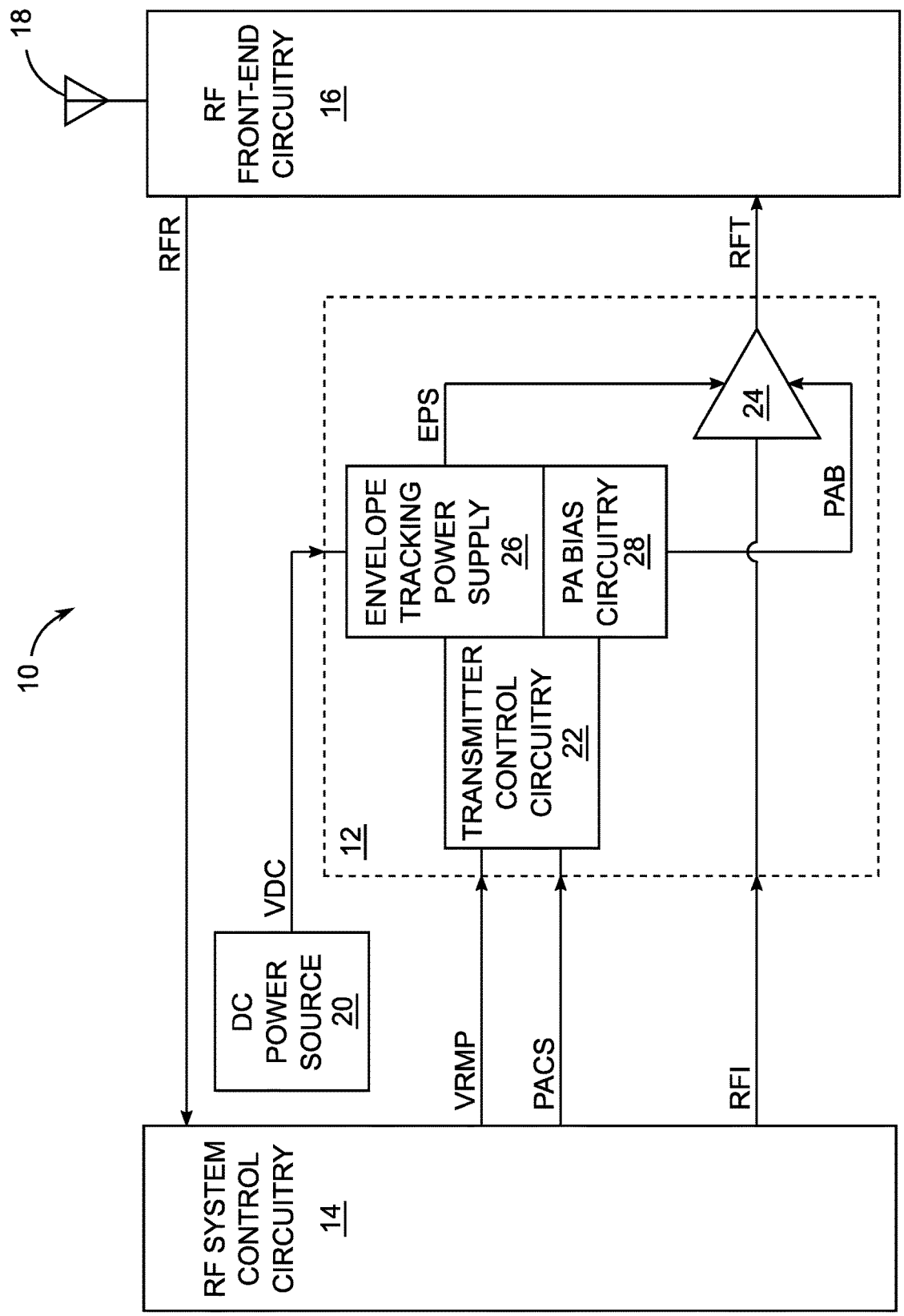
FIG. 1 is a schematic diagram of an exemplary embodiment of a radio frequency (RF) communications system.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Power amplifier (PA) output memory neutralization is disclosed, using baseband input/output (I/O) capacitance current compensation. Radio frequency (RF) PAs experience I/O memory effects when used with envelope tracking supply modulation schemes. Envelope tracking supply modulation results in a nonlinear variation of the I/O capacitance. Traditional approaches compensate for such effects with a current provided by a bias circuit which is band-limited. This results in memory effects which distort the amplified signal, becoming more significant as the modulation bandwidth increases.

An RF communications system according to embodiments disclosed herein mitigates such memory effects by compensating for the non-linear effect of the I/O capacitance in an RF PA. The RF PA can be single- or multi-stage, with an output stage supplied by an envelope tracking power supply. A replica circuit proportionally matches the non-linear I/O capacitance in the output stage. By biasing the replica circuit with the envelope tracking power supply, a replica current is generated. A current mirror generates an error correction current to compensate for the effects of the I/O capacitance in the output stage from the replica current.

FIG. 1 is a schematic diagram of an exemplary embodiment of an RF communications system 10. The RF communications system 10 includes RF transmitter circuitry 12, RF system control circuitry 14, RF front-end circuitry 16, an RF antenna 18, and a direct current (DC) power source 20. The RF transmitter circuitry 12 includes transmitter control circuitry 22, an RF PA 24, an envelope tracking power supply 26, and PA bias circuitry 28.

The RF front-end circuitry 16 receives via the RF antenna 18, processes, and forwards an RF receive signal RFR to the RF system control circuitry 14. The RF system control circuitry 14 provides an envelope power supply control signal VRMP and a transmitter configuration signal PACS to the transmitter control circuitry 22. The RF system control circuitry 14 provides an RF input signal RFI to the RF PA 24. The DC power source 20 provides a DC source signal VDC to the envelope tracking power supply 26. In some examples, the DC power source 20 is a battery.

The transmitter control circuitry 22 is coupled to the envelope tracking power supply 26 and to the PA bias circuitry 28. The envelope tracking power supply 26 provides an envelope power supply signal EPS to the RF PA 24 based on the envelope power supply control signal VRMP. The DC source signal VDC provides power to the envelope tracking power supply 26. As such, the envelope power supply signal EPS is based on the DC source signal VDC. The envelope power supply control signal VRMP is representative of a setpoint of the envelope power supply signal EPS. The RF PA 24 receives and amplifies the RF input signal RFI to provide an RF transmit signal RFT using the envelope power supply signal EPS. The envelope power supply signal EPS provides power for amplification. The RF front-end circuitry 16 receives, processes, and transmits the RF transmit signal RFT via the RF antenna 18. In one embodiment of the RF transmitter circuitry 12, the transmitter control circuitry 22 configures the RF transmitter circuitry 12 based on the transmitter configuration signal PACS.

The PA bias circuitry 28 provides a PA bias signal PAB to the RF PA 24. In this regard, the PA bias circuitry 28 biases the RF PA 24 via the PA bias signal PAB. In some examples, the PA bias circuitry 28 biases the RF PA 24 based on the transmitter configuration signal PACS. In one embodiment of the RF front-end circuitry 16, the RF front-end circuitry 16 includes at least one RF switch, at least one RF amplifier, at least one RF filter, at least one RF duplexer, at least one RF diplexer, at least one RF amplifier, the like, or any combination thereof. In one embodiment of the RF system control circuitry 14, the RF system control circuitry 14 is RF transceiver circuitry, which may include an RF transceiver integrated circuit (IC), baseband controller circuitry, the like, or any combination thereof.

As described above, the RF PA 24 receives and amplifies the RF input signal RFI to provide the RF transmit signal RFT using the envelope power supply signal EPS, which provides power for amplification. The RF input signal RFI and the RF transmit signal RFT are amplitude modulated. Since the amplitude of the RF transmit signal RFT is modulated, the amplitude of the RF transmit signal RFT traverses within an envelope of the RF transmit signal RFT. For proper operation of the RF PA 24, a voltage of the envelope power supply signal EPS must be high enough to accommodate the envelope of the RF transmit signal RFT. However, to increase efficiency in the RF PA 24, the voltage of the envelope power supply signal EPS at least partially tracks the envelope of the RF transmit signal RFT. This tracking by the voltage of the envelope power supply signal EPS is called envelope tracking.

In this regard, since the envelope power supply control signal VRMP is representative of the setpoint of the envelope power supply signal EPS, the envelope power supply control signal VRMP may be received and amplitude modulated to provide at least partial envelope tracking of the RF transmit signal RFT by causing the envelope power supply signal EPS to be amplitude modulated.

Figure 2:
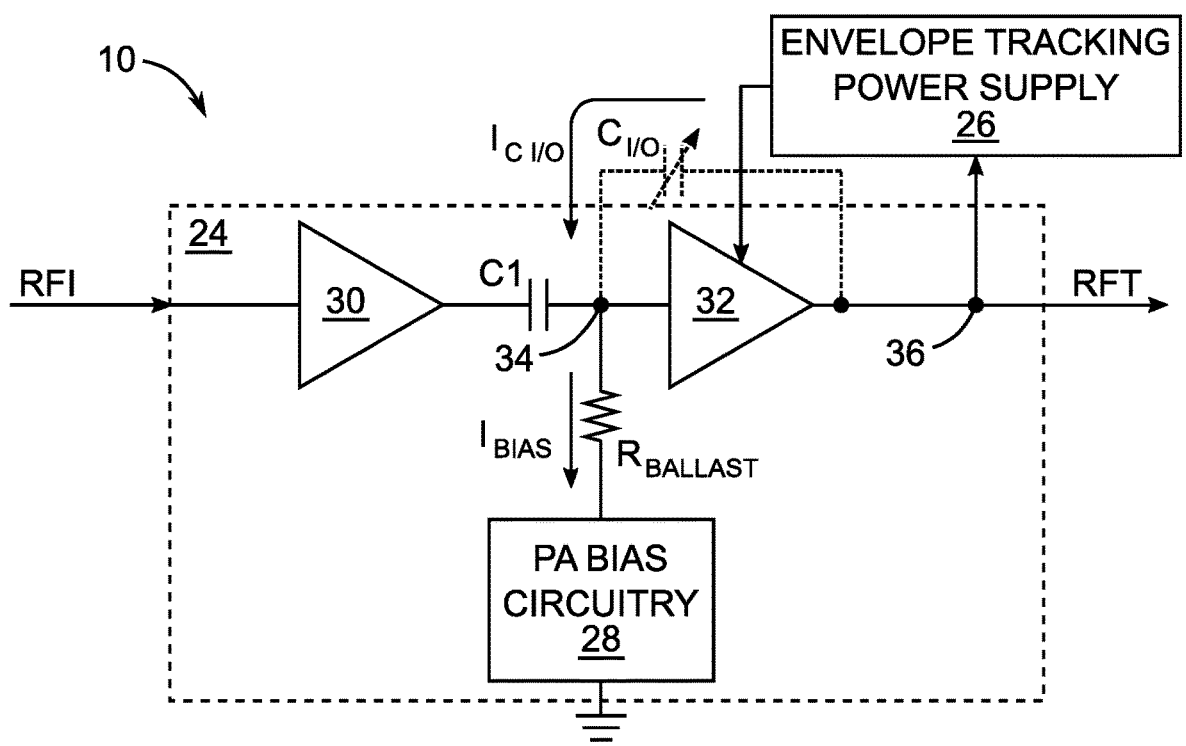
FIG. 2 is a schematic diagram of an exemplary embodiment of an RF power amplifier (PA) of the RF communications system of FIG. 1.

FIG. 2 is a schematic diagram of an exemplary embodiment of the RF PA 24 of the RF communications system 10 of FIG. 1. The RF PA 24 includes one or more amplification stages 30, 32. In the example illustrated in FIG. 2, two amplification stages 30, 32 are provided—a driver stage 30 and an output stage 32. Other examples include more or fewer amplification stages 30, 32. The output stage 32 receives and amplifies an input signal (e.g., the RF input signal RFI) received at a first input node 34 to provide an output signal (e.g., the RF transmit signal RFT) at a first output node 36.

The envelope tracking power supply 26 provides power for amplification which at least partially tracks the envelope of the output signal. In this regard, the output stage 32 is coupled to the envelope tracking power supply 26. The output stage 32 includes an amplifying transistor, which can experience I/O memory effects under the envelope tracking modulation scheme of the envelope tracking power supply 26. As illustrated in FIG. 2, the envelope tracking modulation results in a nonlinear variation of an I/O capacitance $C_{I/O}$ between the first input node 34 and the first output node 36 of the output stage 32. This results in an I/O capacitance current $I_{C\_I/O}$ into the first input node 34.

In further detail, the output stage 32 includes an amplifying transistor coupled to the envelope tracking power supply 26. In some embodiments, the amplifying transistor is a bipolar junction transistor (BJT), a heterojunction bipolar transistor (HBT), or similar transistor having a base, a collector, and an emitter. The base is coupled to the first input node 34 and the collector (or emitter) is coupled to the first output node 36. The envelope tracking power supply 26 provides power to amplify the input signal, but the envelope tracking modulation results in a non-linear variation of the I/O capacitance $C_{I/O}$, which is a base-collector (or base-emitter) capacitance of the amplifying transistor.

In some embodiments, the amplifying transistor is a field-effect transistor (FET), a metal-oxide-semiconductor FET (MOSFET), a junction gate FET (JFET), a heterostructure FET (HFET), or similar transistor having a gate, a drain, and a source. The gate is coupled to the first input node 34 and the drain (or source) is coupled to the first output node 36. The envelope tracking power supply 26 provides power to amplify the input signal, but the envelope tracking modulation results in a non-linear variation of the I/O capacitance $C_{I/O}$, which is a gate-drain (or gate-source) capacitance of the amplifying transistor.

The I/O capacitance current $I_{C\_I/O}$ can result in errors in the output signal (e.g., the RF transmit signal RFT) from the output stage 32. The PA bias circuitry 28 compensates for such errors by pre-distorting a bias current $I_{BIAS}$ at the first input node 34 (e.g., due to high-pass filtering from an interstage capacitance C1 between the driver stage 30 and the output stage 32). However, the PA bias circuitry 28 is internally band-limited. In addition, the PA bias circuitry 28 is coupled to the first input node 34 through a ballast resistance $R_{Ballast}$ and a large input capacitance of the output stage 32, producing additional memory effects (e.g., distortion) at the output stage 32.

Figure 3:
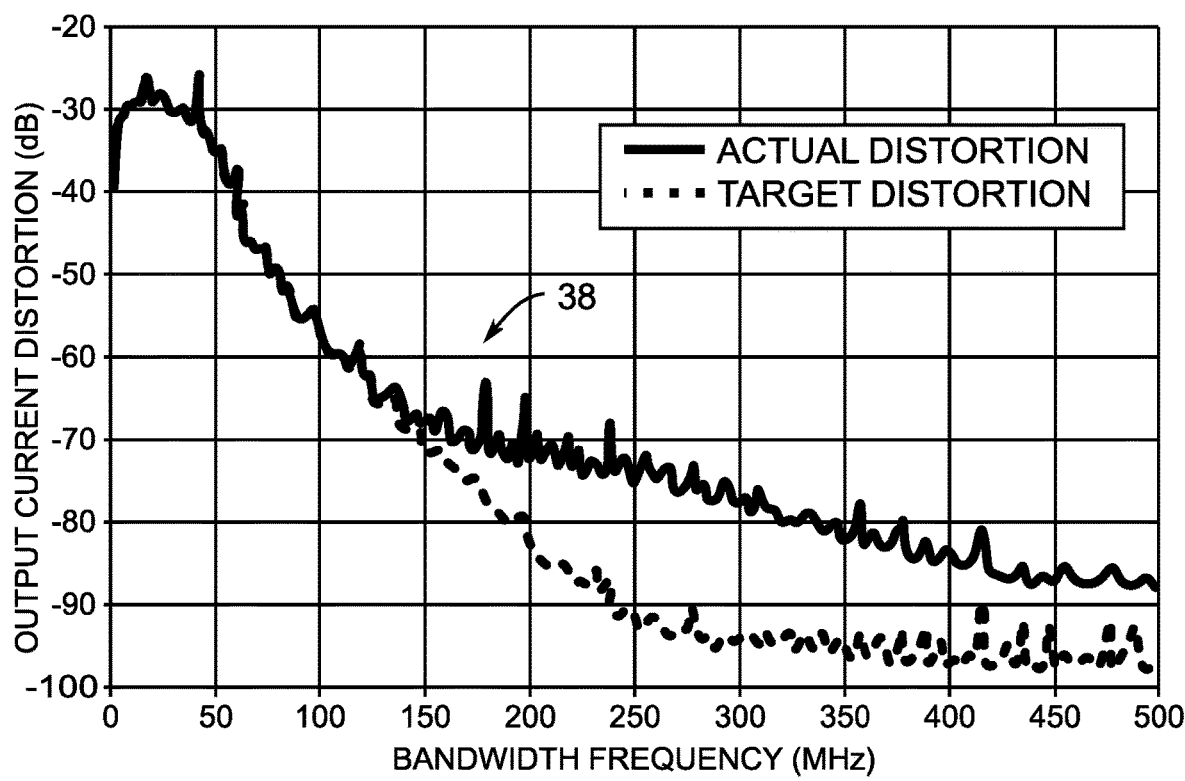
FIG. 3 is a graphical representation of an output current spectrum of the RF PA of FIG. 2.

FIG. 3 is a graphical representation of an output current spectrum 38 of the RF PA 24 of FIG. 2. The output current spectrum 38 illustrates memory effects of the RF PA 24 as a function of the bandwidth frequency of the RF modulation of the input signal (e.g., the RF input signal RFI). As illustrated in FIG. 3, the output current spectrum 38 has significant spectral regrowth after 120 megahertz (MHz). The RF modulation bandwidths under the Fifth Generation (5G) specification can exceed 100 MHz, such as 200 MHz, 400 MHz, 800 MHz, and so on. However, to meet the challenging dynamic linearity specifications of the 5G specification, these memory effects need to be significantly reduced.

Figure 4A:
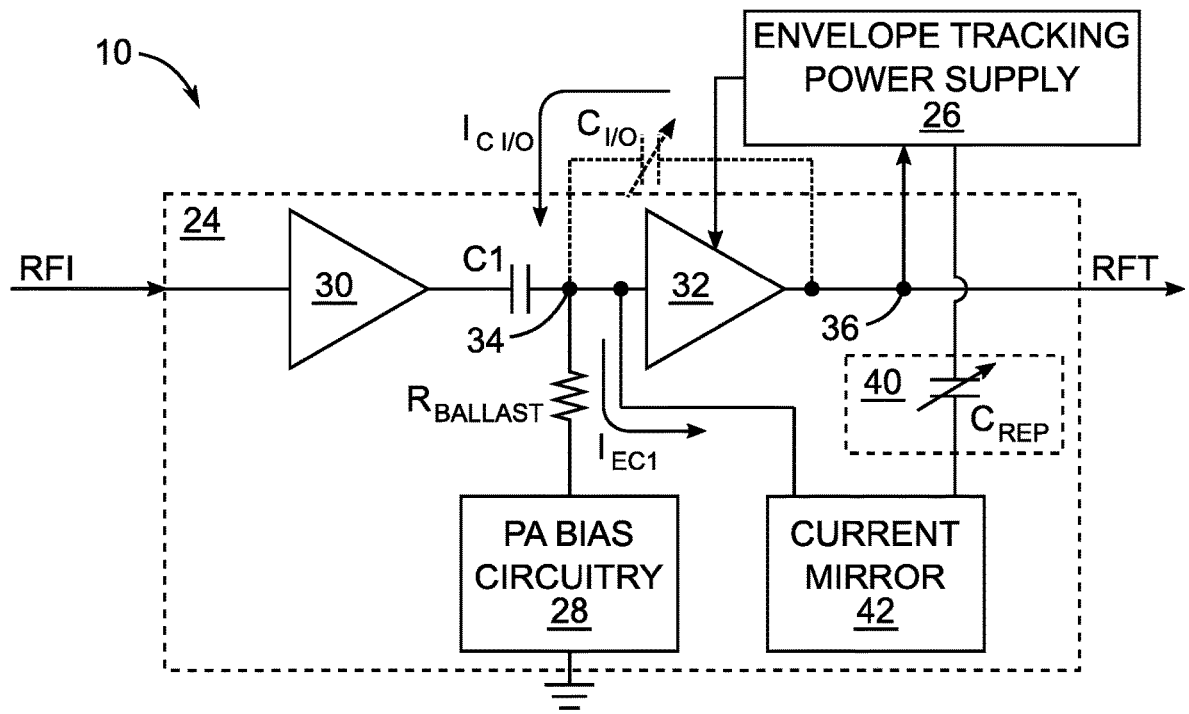
FIG. 4A is a schematic diagram of another exemplary embodiment of the RF PA of the RF communications system of FIG. 1 with output memory neutralization.

FIG. 4A is a schematic diagram of another exemplary embodiment of the RF PA 24 of the RF communications system 10 of FIG. 1 with output memory neutralization. To reduce or eliminate such memory effects at the high modulation bandwidths of 5G communications, the I/O capacitance current $I_{C\_I/O}$ into the first input node 34 needs to be provided from a non-band-limited path. In this regard, the RF PA 24 further includes a replica circuit 40 with a non-linear capacitor $C_{REP}$ proportionally matched to the first I/O capacitance $C_{I/O}$ of the output stage 32. Examples of the non-linear capacitor $C_{REP}$ provide a capacitance which is matched to the first I/O capacitance $C_{I/O}$ but scaled down (e.g., at a fixed ratio). Some examples of the non-linear capacitor $C_{REP}$ provide a capacitance which is 1:1 matched to the first I/O capacitance $C_{I/O}$.

The replica circuit 40 is coupled to the envelope tracking power supply 26 so that the non-linear capacitor $C_{REP}$ is subjected to the same envelope tracking modulation as the output stage 32. The non-linear capacitor $C_{REP}$ can be implemented as a matching transistor, which in some embodiments is a smaller replica of the amplifying transistor in the output stage 32. The non-linear capacitor $C_{REP}$ can be selected smaller in order to avoid large currents in a replica current path, reducing power consumption and size of the replica circuit 40.

The replica circuit 40 is coupled to a current mirror 42, which injects a first error correction current $I_{EC1}$ into the first input node 34 (e.g., directly into a base of the amplifying transistor in the output stage 32). The current mirror 42 multiplies a current through the non-linear capacitor $C_{REP}$ (e.g., by an inverse of the fixed ratio at which the non-linear capacitor $C_{REP}$ is scaled) in order to match the I/O capacitance current $I_{C\_I/O}$. In this manner, the first error correction current $I_{EC1}$ compensates for the first I/O capacitance $C_{I/O}$ (e.g., the base-collector capacitance) of the output stage 32. By matching the non-linear capacitor $C_{REP}$ to the first I/O capacitance $C_{I/O}$ and biasing it from the envelope tracking power supply 26, the first error correction current $I_{EC1}$ and the I/O capacitance current $I_{C\_I/O}$ will be ideally matched. As such, little or none of the first error correction current $I_{EC1}$ will be forced through the band-limited path of the PA bias circuitry 28, eliminating or largely reducing the collector memory effect.

Figure 4B:
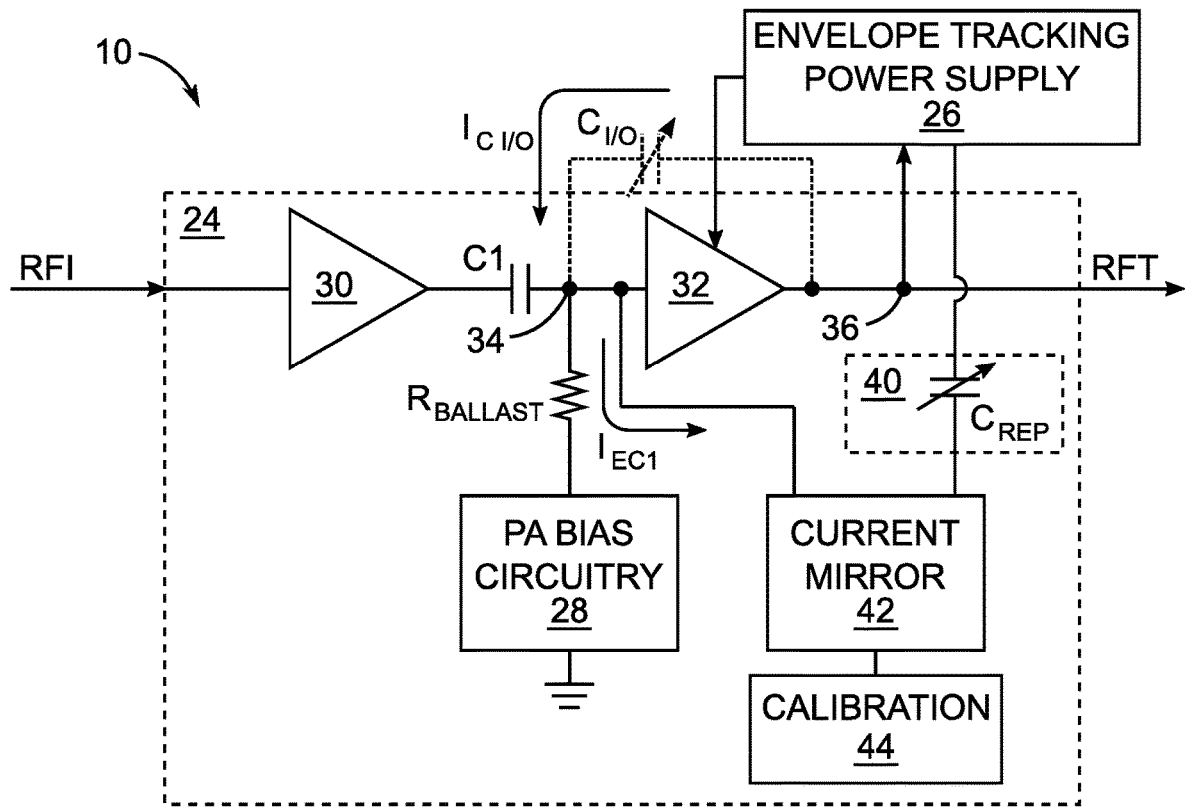
FIG. 4B is another schematic diagram of the RF PA of FIG. 4A.

FIG. 4B is another schematic diagram of the RF PA 24 of FIG. 4A.

In a practical implementation of the RF PA 24, a finite amount of matching can be achieved between the first error correction current $I_{EC1}$ and the I/O capacitance current $I_{C\_I/O}$. A calibration circuit 44 can be used to tune the first error correction current $I_{EC1}$ to achieve sufficient compensation and thus a low enough distortion from the memory effect. The calibration circuit 44 can be implemented in a closed-loop or an open-loop configuration.

Figure 5:
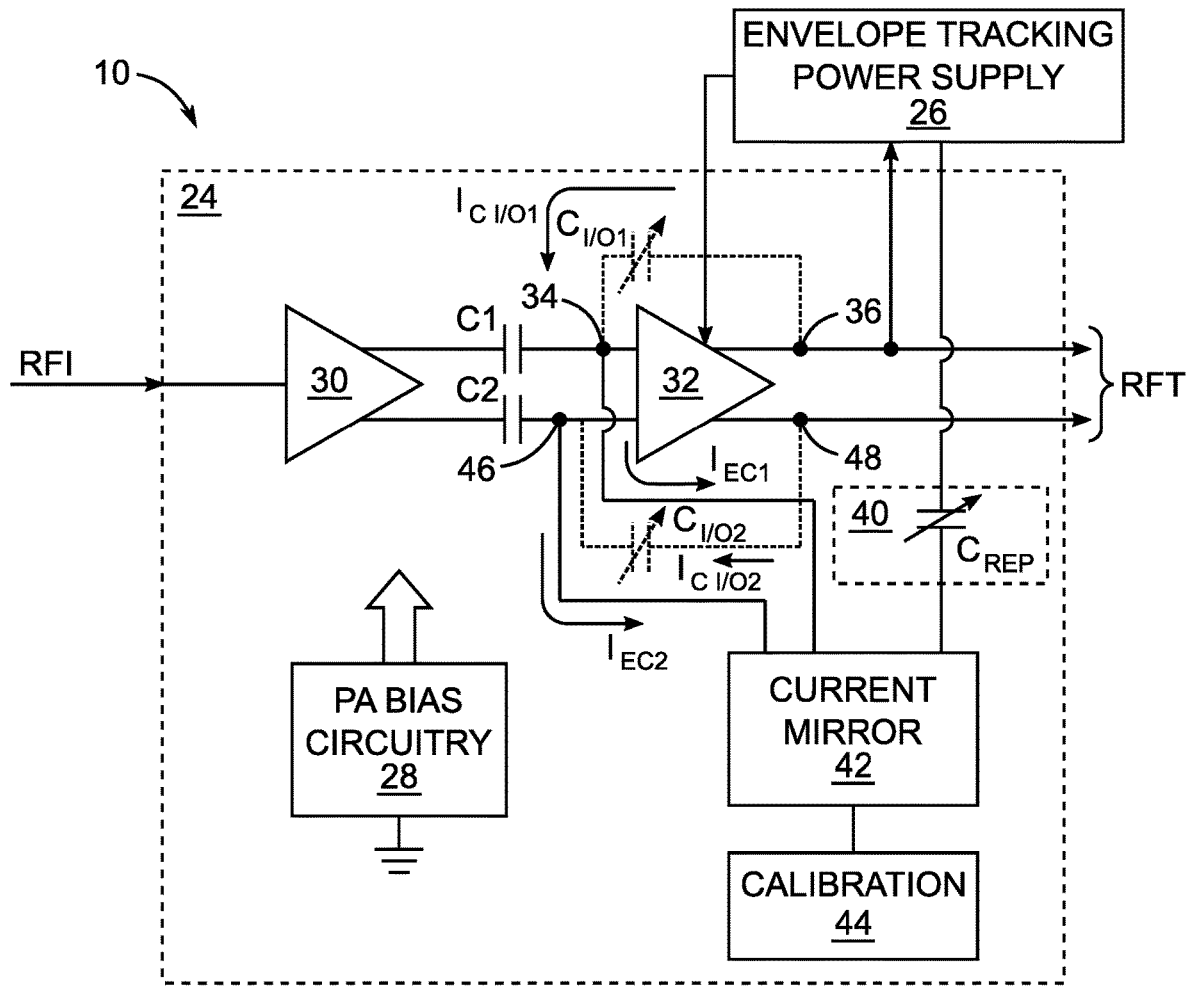
FIG. 5 is a schematic diagram of another exemplary embodiment of the RF PA of the RF communications system of FIG. 1 implemented as a differential amplifier.

FIG. 5 is a schematic diagram of another exemplary embodiment of the RF PA 24 of the RF communications system 10 of FIG. 1 implemented as a differential amplifier. In addition to single-ended amplification (e.g., as illustrated in FIGS. 4A and 4B), the output memory neutralization technique can be applied to the RF PA 24 with the output stage 32 being a differential amplification stage. In this example, the output stage 32 receives and amplifies a differential input signal received at the first input node 34 and a second input node 46 to provide a differential output signal at the first output node 36 and a second output node 48.

Accordingly, the current mirror 42 injects the first error correction current $I_{EC1}$ into the first input node 34 (e.g., directly into the base of a first amplifying transistor in the output stage 32). In addition, the current mirror 42 injects a second error correction current $I_{EC2}$ into the second input node 46 (e.g., directly into a base of a second amplifying transistor in the output stage 32). However, the envelope tracking modulation of the envelope tracking power supply 26 is a common-mode effect which changes a first I/O capacitance $C_{I/O1}$ of the first amplifying transistor and a second I/O capacitance $C_{I/O2}$ of the second amplifying transistor at the same time, and only one non-linear capacitor $C_{REP}$ is needed.

In an exemplary aspect, the compensation path is subjected only to the base-band envelope supply signal, while the output signal from the output stage 32 is subject to both the envelope supply and an RF modulated input signal (e.g., the RF input signal RFI) having a variation around a given common-mode point. If the positive and negative components (e.g., received respectively at the first input node 34 and the second input node 46) of the input signal give about equal and opposed sign capacitance variation (at the first I/O capacitance $C_{I/O1}$ and the second I/O capacitance $C_{I/O2}$), the output signal (e.g., the RF transmit signal RFT) from the output stage 32 will have a zero average impact and the compensation of just the envelope modulation in the first I/O capacitance $C_{I/O1}$ and the second I/O capacitance $C_{I/O2}$ will be accurate.

However, if the first I/O capacitance $C_{I/O1}$ and the second I/O capacitance $C_{I/O2}$ are in the area of faster variation (e.g., when it is closer to forward bias the collector-base junction), the output signal from the output stage 32 may still result in different average capacitance than just the envelope supply by itself. Therefore, in some examples the calibration circuit 44 can include an offset circuit to take into account the power level impact of the input signal on the first I/O capacitance $C_{I/O1}$ and the second I/O capacitance $C_{I/O2}$. This is a secondary effect that in some cases can be neglected.

Figure 6:
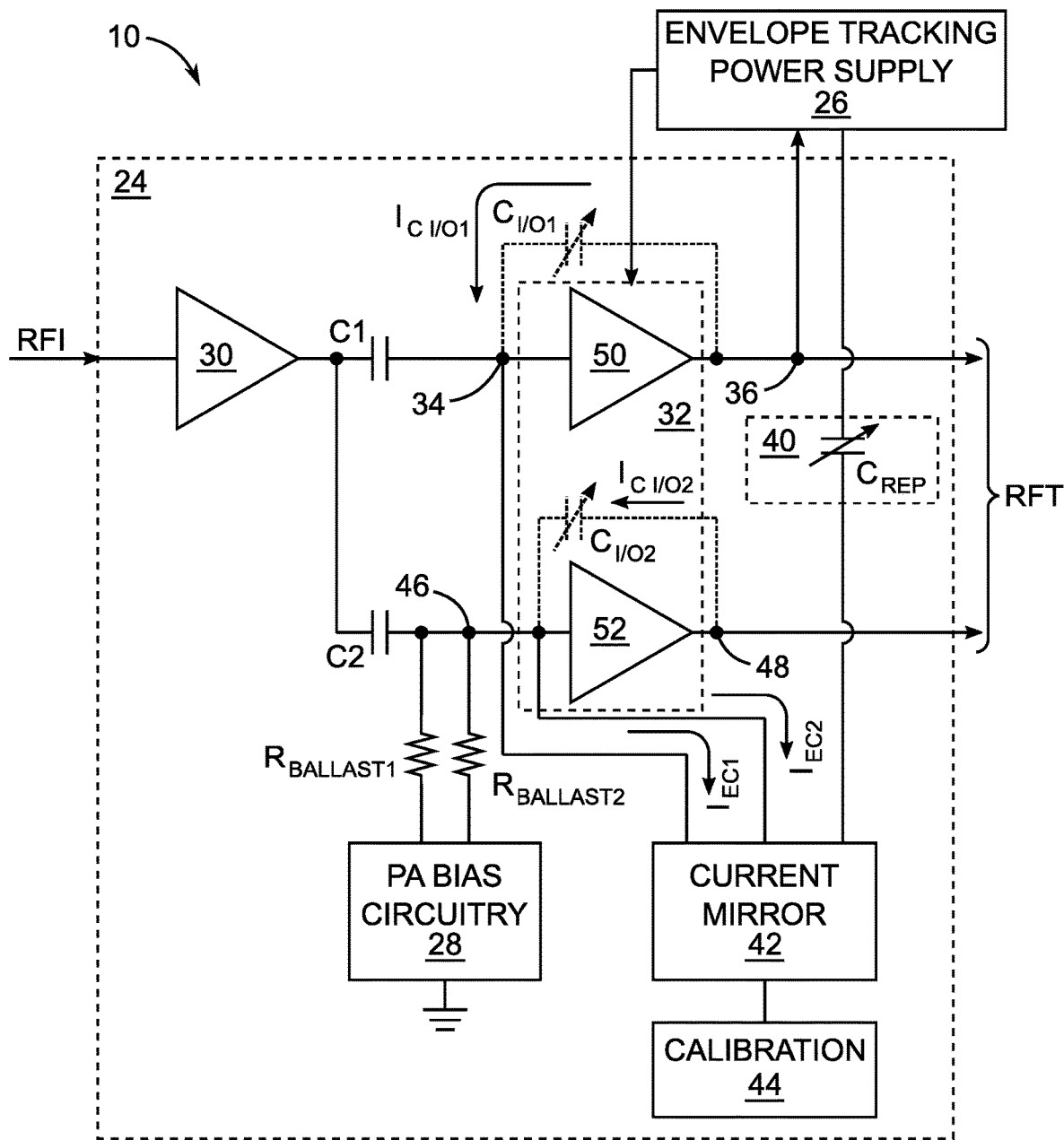
FIG. 6 is a schematic diagram of another exemplary embodiment of the RF PA of the RF communications system of FIG. 1 implemented with a multiunit output stage.

FIG. 6 is a schematic diagram of another exemplary embodiment of the RF PA 24 of the RF communications system 10 of FIG. 1 implemented with a multiunit output stage 32. In many designs, the output stage 32 is not built as a single unit, but it has a number of unit power cells 50, 52 (each of which includes a respective amplifying transistor) connected in parallel. For example, the output stage 32 of FIG. 6 includes a first unit power cell 50 and a second unit power cell 52 parallel to the first unit power cell 50.

Each of the first unit power cell 50 and the second unit power cell 52 is coupled to the input signal (e.g., the RF input signal RFI) and has a separate base terminal (e.g., the first input node 34 and the second input node 46). In this embodiment, multiple compensation current replicas need to be generated in order to compensate for each of the first I/O capacitance $C_{I/O1}$ and the second I/O capacitance $C_{I/O2}$. In this regard, the current mirror 42 includes a first branch which injects the first error correction current $I_{EC1}$ into the first input node 34 (e.g., directly into a base of the first unit power cell 50 in the output stage 32). In addition, the current mirror 42 includes a second branch which injects the second error correction current $I_{EC2}$ into the second input node 46 (e.g., directly into a base of the second unit power cell 52 in the output stage 32).

In some examples, all of the unit power cells 50, 52 share the PA bias circuitry 28 (implemented as a single or multiple circuits) with ballast resistances $R_{Ballast1}$, $R_{Ballast2}$ going to the individual unit power cells 50, 52. The approach illustrated in FIG. 6 can also be applied in the case of a differential output stage 32 that uses a number of unit power cells 50, 52. In some examples, the unit power cells 50, 52 are single-ended, so each differential unit power cell uses two single-ended unit power cells 50, 52. In such examples, the PA bias circuitry 28 can be implemented as two separate circuits for the two sides of the differential amplifier.

Those skilled in the art will recognize improvements and modifications to the preferred embodiments of the present disclosure. All such improvements and modifications are considered within the scope of the concepts disclosed herein and the claims that follow.

What is claimed is:
1. A power amplifier, comprising:
    an output stage which receives and amplifies an input signal received at a first input node using an envelope tracking power supply;
    a replica circuit comprising a non-linear capacitor proportionally matched to a first input/output (I/O) capacitance of the output stage; and
    a current mirror coupled to the replica circuit and configured to inject a first error correction current into the first input node.
2. The power amplifier of claim 1, wherein the non-linear capacitor is matched to the first I/O capacitance of the output stage at a fixed ratio.
3. The power amplifier of claim 2, wherein:
    the output stage comprises an amplifying transistor coupled to the envelope tracking power supply; and
    the non-linear capacitor comprises a matching transistor coupled to the envelope tracking power supply.
4. The power amplifier of claim 2, wherein the current mirror multiplies a current through the non-linear capacitor by an inverse of the fixed ratio.
5. The power amplifier of claim 1, wherein the non-linear capacitor is 1:1 matched to the first I/O capacitance of the output stage.
6. The power amplifier of claim 1, wherein:
    the output stage comprises one or more of a bipolar junction transistor (BJT) or a heterojunction bipolar transistor (HBT); and
    the first I/O capacitance is a base-collector capacitance or a base-emitter capacitance of the output stage.
7. The power amplifier of claim 1, wherein:
    the output stage comprises one or more of a field-effect transistor (FET), a metal-oxide-semiconductor FET (MOSFET), a junction gate FET (JFET), or a heterostructure FET (HFET); and
    the first I/O capacitance is a gate-drain capacitance or a gate-source capacitance of the output stage.
8. The power amplifier of claim 1, wherein the output stage is a single-ended amplification stage.
9. The power amplifier of claim 1, wherein the output stage is a differential amplification stage having the first input node and a second input node.
10. The power amplifier of claim 9, wherein the current mirror is further configured to inject a second error correction current into the second input node.
11. The power amplifier of claim 10, further comprising a calibration circuit configured to calibrate the first error correction current and the second error correction current to take into account power level impact of the input signal on the first I/O capacitance.
12. The power amplifier of claim 1, wherein the output stage comprises a first unit power cell and a second unit power cell parallel to the first unit power cell.
13. The power amplifier of claim 12, wherein the current mirror comprises:
    a first branch configured to inject the first error correction current into the first input node of the first unit power cell; and a second branch to inject a second error correction current into a second input node coupled to the second unit power cell.

14. A radio frequency (RF) communications system, comprising:
an amplifier stage configured to provide envelope tracked amplification of an input signal, wherein the amplifier stage has a first input/output (I/O) capacitance between a first input node and a first output node;
a replica circuit configured to proportionally match the first I/O capacitance; and
a current mirror coupled to the replica circuit and configured to provide an error correction current compensating for the first I/O capacitance.

15. The RF communications system of claim 14, wherein the current mirror multiplies a current through the replica circuit such that the error correction current matches an error current caused by the first I/O capacitance.

16. The RF communications system of claim 14, wherein the amplifier stage is configured to receive the input signal having an RF bandwidth greater than 100 megahertz (MHz).

17. The RF communications system of claim 16, wherein the current mirror is further configured to provide a second order correction for an impact of the RF bandwidth of the input signal on an average of the first I/O capacitance.

18. The RF communications system of claim 14, wherein the amplifier stage comprises a transistor having a base coupled to the first input node and a collector coupled to the first output node, with power supplied by an envelope tracking power supply.

19. The power amplifier of claim 18, wherein the current mirror is configured to inject the error correction current into the base.

20. The power amplifier of claim 14, wherein:
the amplifier stage further has a second I/O capacitance between a second input node and a second output node; and
the current mirror is further configured to compensate for the second I/O capacitance.

* * * * *